US012666707B2

(12) United States Patent
Wang et al.

(10) Patent No.: US 12,666,707 B2
(45) Date of Patent: Jun. 23, 2026

(54) METHOD FOR FABRICATING SEMICONDUCTOR DEVICE USING PATTERNED MASK FOR FORMING HARD MASKS ON GATE STRUCTURES

(71) Applicant: United Semiconductor (Xiamen) Co., Ltd., Xiamen (CN)

(72) Inventors: Wen Wei Wang, Shamen City (CN); Xiang Xiang Zhou, Shamen City (CN); Xiang Wang, Shamen City (CN); Hailong Gu, Singapore (SG); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 394 days.

(21) Appl. No.: 18/367,472

(22) Filed: Sep. 13, 2023

(65) Prior Publication Data

US 2025/0063802 A1 Feb. 20, 2025

(30) Foreign Application Priority Data

Aug. 14, 2023 (CN) .......................... 202311017844.2

(51) Int. Cl.
H10D 84/85 (2025.01)
H10D 84/01 (2025.01)
H10D 84/03 (2025.01)

(52) U.S. Cl.
CPC ......... H10D 84/85 (2025.01); H10D 84/0142 (2025.01); H10D 84/0165 (2025.01); H10D 84/0179 (2025.01); H10D 84/038 (2025.01)

(58) Field of Classification Search
CPC .............. H10D 84/01; H10D 84/0135; H10D 84/0142; H10D 84/0165; H10D 84/017; H10D 84/0172; H10D 84/0179; H10D 84/038; H10D 84/82; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/85; H10D 84/851–852
See application file for complete search history.

(56) References Cited

U.S. PATENT DOCUMENTS

2010/0087055 A1* 4/2010 Lai ..................... H10D 84/0179
257/E21.409

* cited by examiner

*Primary Examiner* — Cheung Lee
(74) *Attorney, Agent, or Firm* — Winston Hsu

(57) ABSTRACT

A method for fabricating a semiconductor device includes the steps of first providing a substrate having a first transistor region and a second transistor region and then forming a first gate structure on the first transistor region and a second gate structure on the second transistor region, in which the first gate structure includes a first hard mask, the second gate structure includes a second hard mask, and the first hard mask and the second hard mask have different thicknesses. Next, a patterned mask is formed around the first gate structure and the second gate structure, and then part of the first hard mask is removed.

8 Claims, 4 Drawing Sheets

METHOD FOR FABRICATING SEMICONDUCTOR DEVICE USING PATTERNED MASK FOR FORMING HARD MASKS ON GATE STRUCTURES

BACKGROUND OF THE INVENTION

1. Field of the Invention

The invention relates to a method for fabricating semiconductor device, and more particularly to a method of using patterned mask for forming hard mask on top of gate structure.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistor in particularly during the formation of PMOS transistor devices, growth of epitaxial layer on the PMOS region often results in thickness of hard mask in the PMOS transistor to be different from the thickness of hard mask in the NMOS transistor thereby affecting the performance of the device. Hence, how to resolve this issue has become an important task in this field.

SUMMARY OF THE INVENTION

According to an embodiment of the present invention, a method for fabricating a semiconductor device includes the steps of first providing a substrate having a first transistor region and a second transistor region and then forming a first gate structure on the first transistor region and a second gate structure on the second transistor region, in which the first gate structure includes a first hard mask, the second gate structure includes a second hard mask, and the first hard mask and the second hard mask have different thicknesses. Next, a patterned mask is formed around the first gate structure and the second gate structure, and then part of the first hard mask is removed.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
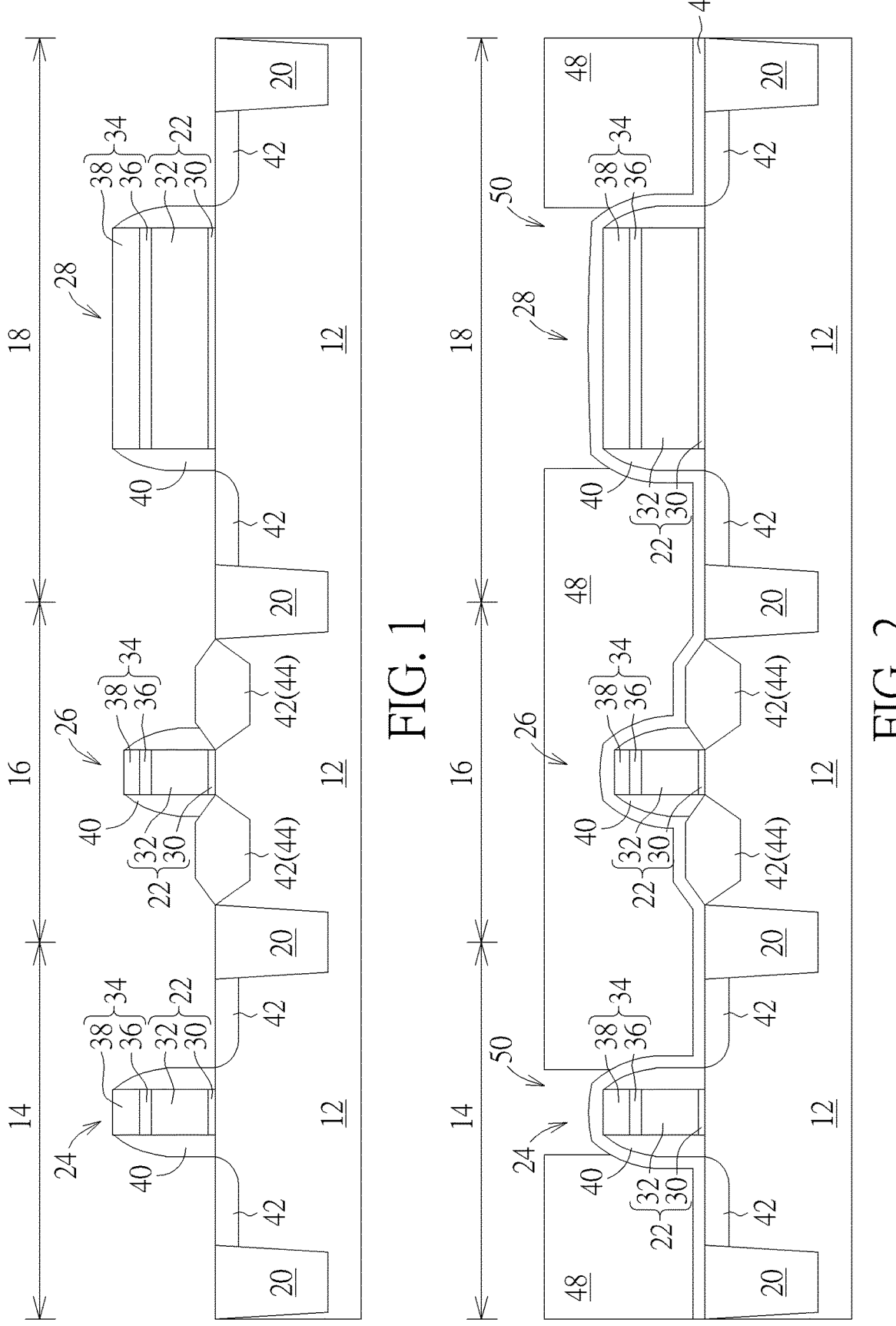
FIGS. 1-8 illustrate a method for fabricating semiconductor device according to an embodiment of the present invention.

Referring to FIGS. 1-8, FIGS. 1-8 illustrate a method for fabricating semiconductor device according to an embodiment of the present invention. As shown in FIG. 1, a substrate 12 is first provided, in which the substrate could be a silicon substrate or silicon-on-insulator (SOI) substrate. Three transistor regions including a transistor region 14, a transistor region 16, and a transistor region 18 could be defined on the substrate 12 and one or more shallow trench isolation (STI) made of silicon oxide could be formed in the substrate 12 for electrical isolation. In this embodiment, the transistor region 14 includes a NMOS transistor region, the transistor region 16 includes a PMOS transistor region, and the transistor region 18 includes another NMOS transistor region, in which the transistor regions 14, 16 are used for preparing gate structures having smaller widths while the transistor region 18 is used for fabricating gate structure with greater widths.

It should be noted that even though the present invention pertains to a method for fabricating planar field effect transistor (FET), according to other embodiment of the present invention, the following process could also be employed for fabricating non-planar devices such as fin field effect transistor (FinFET) device. In this instance, the substrate 12 shown in FIG. 1 would then be fin-shaped structures disposed on the substrate 12.

According to an embodiment of the present invention, the fin-shaped structures could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate, 12, and through an etching process, the pattern of the patterned mask is transferred to the substrate 12 to form the fin-shaped structure. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures. These approaches for forming fin-shaped structures are all within the scope of the present invention.

Next, at least a gate structure such as gate structures 24, 26, 28 or dummy gates are formed on the substrate 12. In this embodiment, the formation of the gate structures 24, 26, 28 could be accomplished by a gate first process, a high-k first approach from gate last process, or a high-k last approach from gate last process. Since this embodiment pertains to a high-k last approach, a gate dielectric layer 30 or interfacial layer, a gate material layer 32 made of polysilicon, and a selective hard mask 34 could be formed sequentially on the substrate 12, and a pattern transfer process is then conducted by using a patterned resist (not shown) as mask to remove part of the hard mask 34, part of the gate material layer 32, and part of the gate dielectric layer 30 through single or multiple etching processes. After stripping the patterned resist, gate structures 24, 26, 28 each made of a patterned gate dielectric layer 30, a patterned gate material layer 32, and a patterned hard mask 34 are formed on the substrate 12, in which the patterned gate dielectric layer 30 and patterned gate material layer 32 together could constitute a gate electrode 22 for each of the gate structures 24, 26, 28. In this embodiment, the hard mask 34 preferably includes a dual-layer structure, in which the bottom hard mask 36 preferably includes silicon nitride while the top hard mask 38 includes silicon oxide, but not limited thereto.

Next, at least a spacer 40 is formed on the sidewalls of each of the gate structures 24, 26, 28, a source/drain region 42 and/or epitaxial layer 44 is formed in the substrate 12 adjacent to two sides of the spacer 40, and a selective silicide (not shown) is formed on the surface of the source/drain region 42 and/or epitaxial layer 44. In this embodiment, the spacer 40 could be a single spacer or a composite spacer. For instance, the spacer 40 could further include an offset spacer (not shown) and a main spacer (not shown), and the spacer 40 could be selected from the group consisting of $SiO_2$, SiN, SiON, and SiCN. The source/drain region 42 and epitaxial layer 44 could include different dopants or different material depending on the type of transistor being fabricated. For instance, the source/drain region 42 could include p-type or n-type dopants and the epitaxial layer 44 could include SiGe, SiC, or SiP.

In this embodiment, the epitaxial layers 44 could also be formed to include different materials depending on the type of transistor being fabricated. For instance, if the MOS transistor being fabricated were to be a PMOS transistor, the epitaxial layers 44 could be made of material including but not limited to for example SiGe, SiGeB, or SiGeSn. If the MOS transistor being fabricated were to be a NMOS transistor, the epitaxial layers 44 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 44 are preferred to have less or no germanium atom at all to facilitate the formation of silicide afterwards.

According to an embodiment of the present invention, it would also be desirable to form source/drain regions 42 in part or all of the epitaxial layers 44. According to another embodiment of the present invention, the source/drain regions 42 could also be formed insituly during the SEG process. For instance, the source/drain regions 42 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 42. Moreover, the dopants within the source/drain regions 42 could also be formed with a gradient, which is also within the scope of the present invention.

It should be noted that during the formation of the source/drain regions 42, it would be desirable to conduct an ion implantation process to form the source/drain regions 42 on the transistor regions 14, 18 for fabricating NMOS transistors as an epitaxial growth process is conducted to form the source/drain region 42 on the transistor region 16 for forming a PMOS transistor. Since multiple etching processes are conducted to form recesses during the formation of epitaxial layers 44, the hard mask 38 directly on top of the gate electrode 22 on the transistor region 16 is often consumed during the etching processes while the thickness of the hard masks 38 on the gate electrodes 22 on both transistor regions 14, 18 is maintained the same. In other words, after the source/drain regions 42 are formed the thickness of the bottom hard mask 36 on the gate electrode 22 of the transistor region 16 would remain the same as the thickness of the bottom hard mask 36 on the transistor regions 14, 18 but the thickness of the top hard mask 38 on the gate electrode 22 of the transistor region 16 would be slightly less than the thickness of the top hard mask 38 on the transistor regions 14, 18. According to an embodiment of the present invention, the thickness of the hard mask 38 on the transistor region 16 could be approximately 80%, 70%, 60%, 50%, or even less than 50% of the thickness of the hard mask 38 on the transistor regions 14, 18.

Next, as shown in FIG. 2, a buffer layer 46 is formed on the gate structures 24, 26, 28 on the transistor regions 14, 16, 18, and then a patterned mask 48 such as patterned resist is formed on the buffer layer 46, in which the patterned mask 48 includes openings 50 exposing the surface of the buffer layer 46 on the transistor regions 14 and 18. In this embodiment, the buffer layer 46 preferably includes silicon nitride, but not limited thereto.

Figures 3, 4:
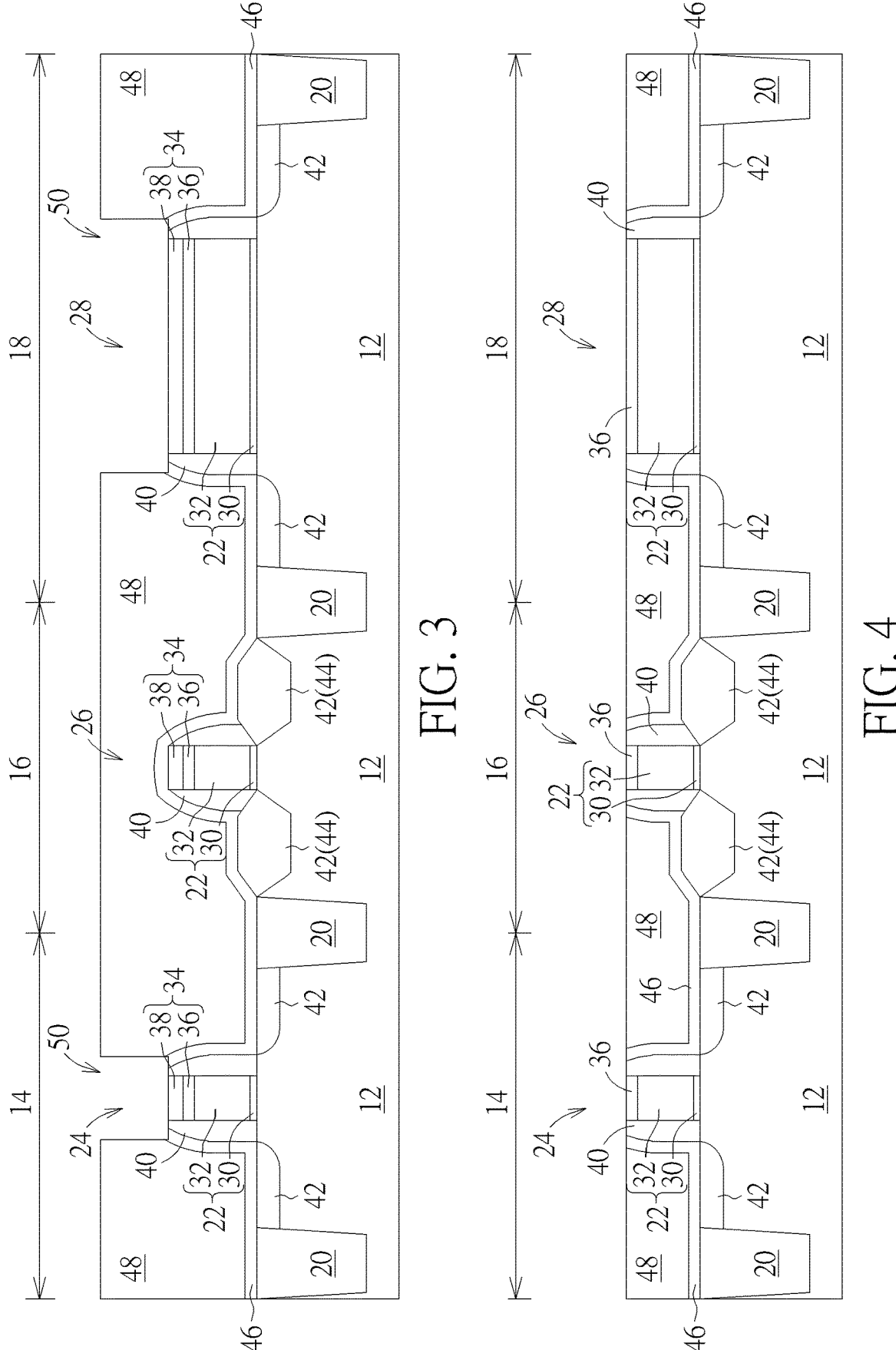

Next, as shown in FIG. 3, an etching process is conducted by using the patterned mask 48 as mask to remove part of the buffer layer 46 and part of the hard mask 38 on the transistor regions 14, 18 so that the thickness of the remaining hard masks 38 on the transistor regions 14, 18 is substantially equal to the thickness of the hard mask 38 on the transistor region 16 that has been covered by the patterned mask 48.

Next, as shown in FIG. 4, an etching process is conducted to remove part of the patterned mask 48 and exposing the hard mask 38 on the transistor region 16 while the top surface of the remaining patterned mask 48 is even with or slightly lower than the top surface of the hard masks 38 on the transistor regions 14, 16, 18. Next, another etching process is conducted to remove all the top hard masks 38 made of silicon oxide on the transistor regions 14, 16, 18 and expose the bottom hard masks 36 made of silicon nitride.

Figures 5, 6:
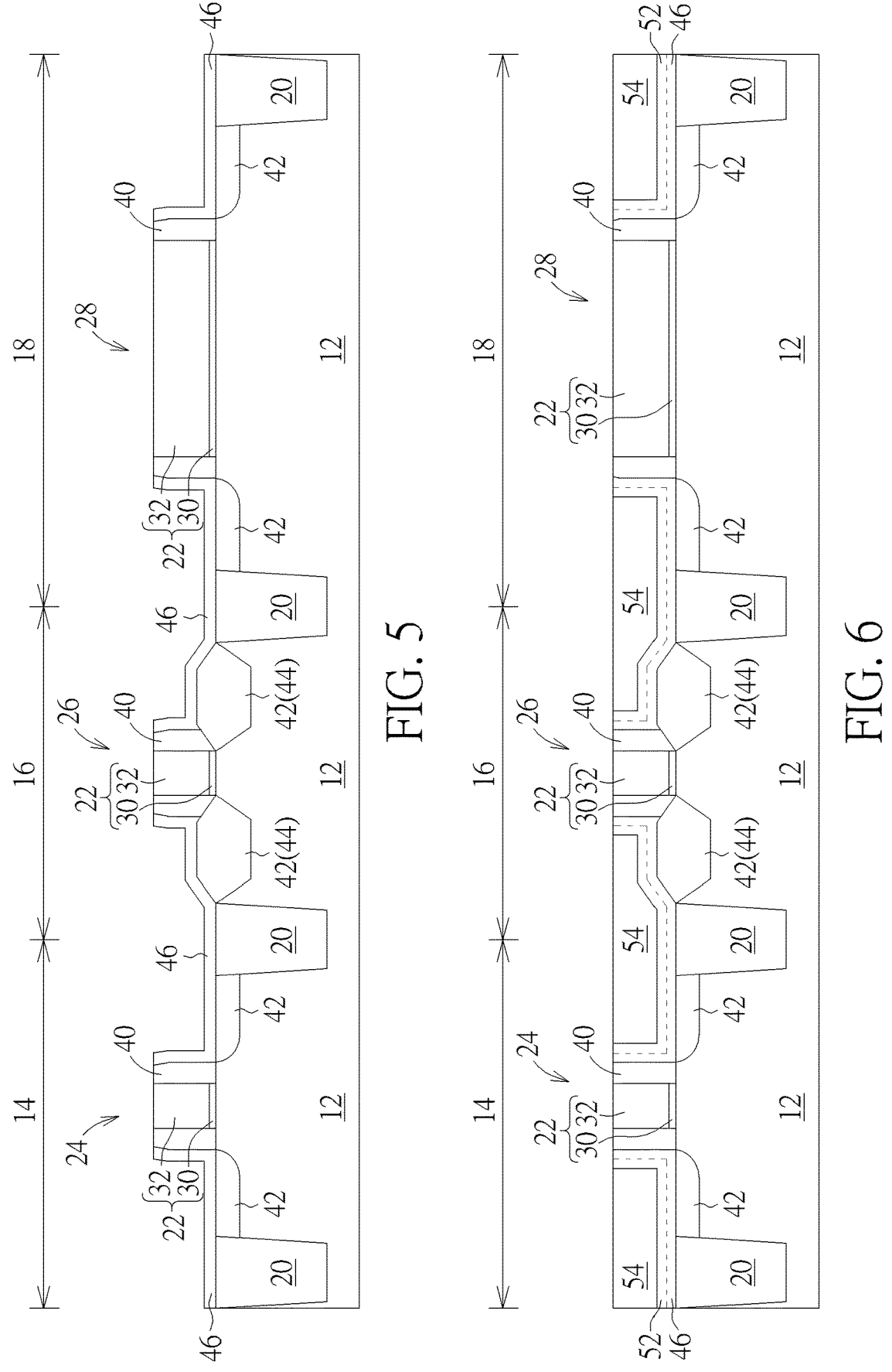

Next, as shown in FIG. 5, a planarizing process such as a chemical mechanical polishing (CMP) process is conducted to remove the bottom hard masks 36 and even part of the patterned mask 48, and then the patterned mask 48 is stripped entirely to expose the buffer layer 46 underneath.

Next, as shown in FIG. 6, a contact etch stop layer (CESL) 52 is formed on surface of the buffer layer 46 and an interlayer dielectric (ILD) layer 54 is formed on the CESL 52. Next, a planarizing process such as CMP is conducted to remove part of the ILD layer 54 and part of the CESL 52 for exposing the gate material layer 32 made of polysilicon so that the top surface of the gate material layer 32 is even with the top surface of the ILD layer 54. It should be noted that since the CESL 52 and the buffer layer 46 are made of silicon nitride the two layers 46, 52 could be united into a single layer.

Figures 7, 8:
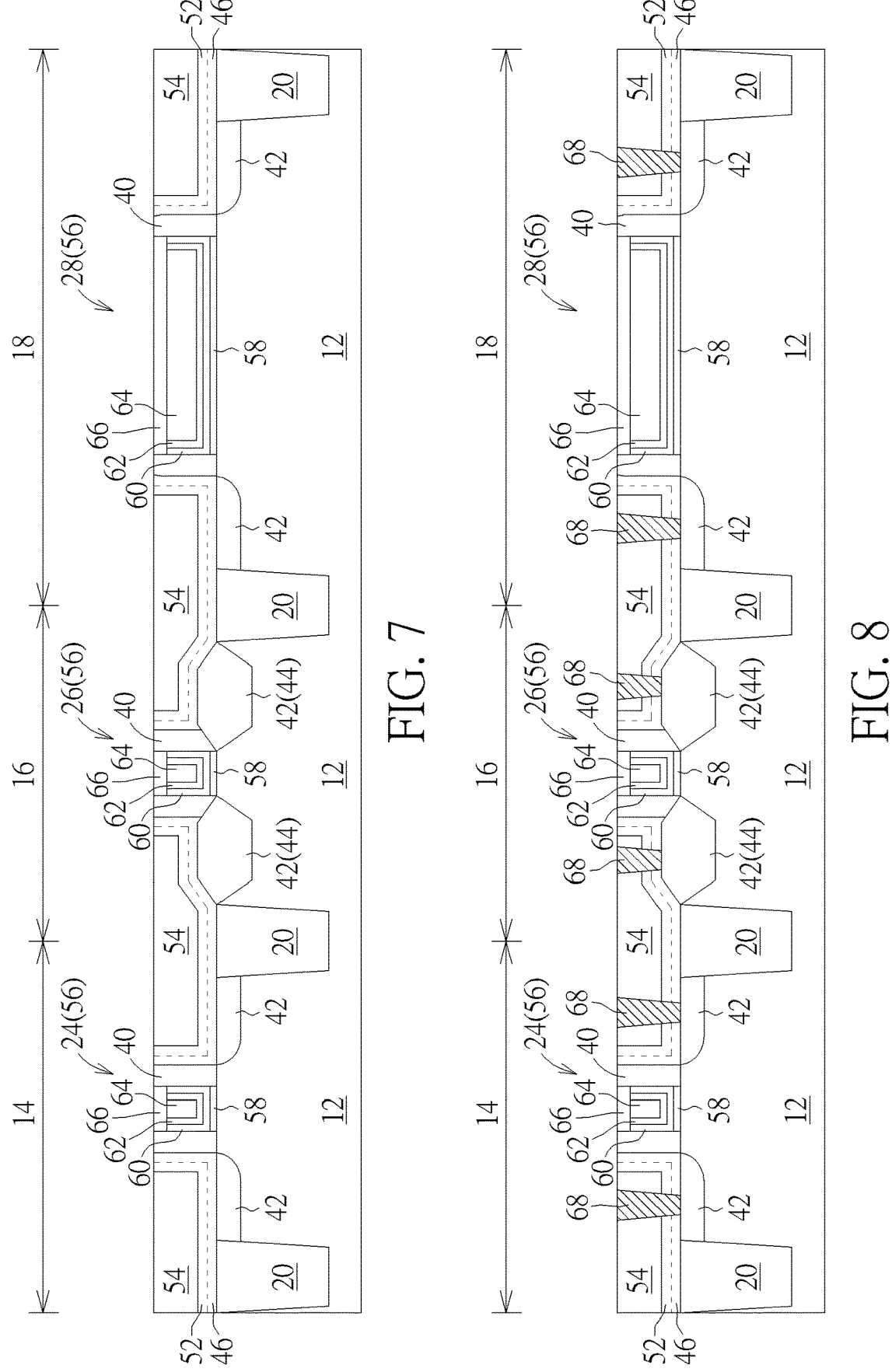

Next, as shown in FIG. 7, a replacement metal gate (RMG) process is conducted to transform the gate structures 24, 26, 28 on the transistor regions 14, 16, 18 into metal gates. For instance, the RMG process could be accomplished by first performing a selective dry etching or wet etching process using etchants including but not limited to for example ammonium hydroxide (NH+OH) or tetramethyl-ammonium hydroxide (TMAH) to remove the gate material layer 32 and even gate dielectric layer 30 from each of the gate structures 24, 26, 28 for forming recesses (not shown) in the ILD layer 54.

Next, a selective interfacial layer 58 or gate dielectric layer, a high-k dielectric layer 60, a work function metal layer 62, and a low resistance metal layer 64 are formed in the recesses, and a planarizing process such as CMP is conducted to remove part of low resistance metal layer 64, part of work function metal layer 62, and part of high-k dielectric layer 60 to form metal gates 56. In this embodiment, the gate structures or metal gates 56 fabricated through high-k last process of a gate last process preferably includes an interfacial layer 58 or gate dielectric layer, a U-shaped high-k dielectric layer 60, a U-shaped work function metal layer 62, and a low resistance metal layer 64.

In this embodiment, the high-k dielectric layer 60 is preferably selected from dielectric materials having dielectric constant (k value) larger than 4. For instance, the high-k dielectric layer 60 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 62 is formed for tuning the work function of the metal gate in accordance with the conductivity of the device. For an NMOS transistor, the work function metal layer 62 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 62 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 62 and the low resistance metal layer 64, in which the material of the barrier layer may include titanium (Ti), titanium nitride (TiN), tantalum (Ta) or tantalum nitride (TaN). Furthermore, the material of the low-resistance metal layer 64 may include copper (Cu), aluminum (Al), titanium aluminum (TiAl), cobalt tungsten phosphide (CoWP) or any combination thereof.

Next, part of the low resistance metal layer 64, part of work function metal layer 62, and part of the high-k dielectric layer 60 could be removed to form recesses (not shown), a hard mask 66 is formed into each of the recesses, and a planarizing process is conducted so that the top surface of the hard mask 66 is even with the top surface of the ILD layer 54. In this embodiment, the hard mask 66 could be selected from the group consisting of consisting of $SiO_2$, SIN, SiON, and SiCN.

Next, as shown in FIG. 8, a photo-etching process is conducted by using a patterned mask (not shown) as mask to remove part of the ILD layer 54, part of the CESL 52, and part of the buffer layer 46 adjacent to the gate structures 24, 26, 28 for forming contact holes (not shown) exposing the source/drain regions 42. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 68 electrically connecting the source/drain regions 42. This completes the fabrication of a semiconductor device according to an embodiment of the present invention.

Overall, the present invention first forms gate structure on the substrate, uses a patterned mask 48 to remove part of the hard mask directly on top of the gate electrode on the NMOS region so that the thickness of the hard mask 38 on the NMOS region becomes substantially equal to the thickness of the hard mask 38 on the PMOS region, conducts a planarizing process and/or etching process to remove all the hard masks and patterned mask on the two transistor regions, and then conducts a RMG process to transform the gate electrodes into metal gates. Since current fabrication of PMOS device involving growth of epitaxial layer often results in hard mask directly on the gate electrode of PMOS region to be thinner than the hard mask on the NMOS region, the present invention could resolve this issue by following the aforementioned approach of fabrication and ultimately improve loading effect and performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a first transistor region and a second transistor region;
   forming a first gate structure on the first transistor region and a second gate structure on the second transistor region, wherein the first gate structure comprises a first hard mask, the second gate structure comprises a second hard mask, and the first hard mask and the second hard mask comprise different thicknesses;
   forming a patterned mask around the first gate structure and the second gate structure; and
   removing part of the first hard mask and none of the second hard mask.

2. The method of claim 1, wherein the substrate comprises a third transistor region, the method further comprising:
   forming a third gate structure on the third transistor region, wherein the third gate structure comprises a third hard mask;
   forming a first source/drain region adjacent to the first gate structure, a second source/drain region adjacent to the second gate structure, and a third source/drain region adjacent to the third gate structure;
   forming a buffer layer on the first gate structure, the second gate structure, and the third gate structure;
   forming the patterned mask around the first gate structure, the second gate structure, and the third gate structure;
   removing the buffer layer, part of the first hard mask, and part of the third hard mask;
   planarizing the first hard mask, the second hard mask, and the third hard mask; and
   removing the patterned mask.

3. The method of claim 2, further comprising:

forming a contact etch stop layer (CESL) on the buffer layer;

forming an interlayer dielectric (ILD) layer on the CESL; and performing a replacement metal gate (RMG) process to transform the first gate structure, the second gate structure, and the third gate structure into metal gates.

4. The method of claim 2, wherein a width of the first gate structure is less than a width of the third gate structure.

5. The method of claim 2, wherein a width of the second gate structure is less than a width of the third gate structure.

6. The method of claim 1, wherein a top surface of the second hard mask is lower than a top surface of the first hard mask.

7. The method of claim 1, wherein the first transistor region comprises a NMOS region.

8. The method of claim 1, wherein the second transistor region comprises a PMOS region.

* * * * *